(12) United States Patent
Churchill

(10) Patent No.: US 6,392,941 B1
(45) Date of Patent: May 21, 2002

(54) WORDLINE AND PSEUDO READ STRESS TEST FOR SRAM

(75) Inventor: Jonathan F. Churchill, Reading (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/753,066

(22) Filed: Dec. 29, 2000

(51) Int. Cl.[7] .................................................. G11C 7/01
(52) U.S. Cl. ............. 365/201; 365/230.01; 365/230.03; 714/718
(58) Field of Search ............................. 365/201, 230.01, 365/230.03; 714/718

(56) References Cited

U.S. PATENT DOCUMENTS

| | | | | |
|---|---|---|---|---|
| 5,629,943 A | * | 5/1997 | McClure .................... 371/21.1 |
| 5,654,925 A | * | 8/1997 | Koh et al. ................... 365/201 |
| 5,745,432 A | * | 4/1998 | McClure ................ 365/230.06 |
| 5,793,685 A | * | 8/1998 | Suma ......................... 365/201 |
| 5,835,427 A | * | 11/1998 | McClure ..................... 365/201 |
| 5,848,018 A | * | 12/1998 | McClure ..................... 365/201 |
| 5,936,977 A | | 8/1999 | Churchill et al. ......... 371/22.31 |
| 5,953,285 A | | 9/1999 | Churchill et al. ........... 365/233 |
| 6,144,594 A | * | 11/2000 | McClure ..................... 365/201 |
| 6,249,479 B1 | * | 6/2001 | Tanzawwa et al. .... 365/230.06 |
| 6,304,504 B1 | * | 10/2001 | Chevallier et al. .......... 365/201 |

* cited by examiner

Primary Examiner—Viet Q. Nguyen
(74) Attorney, Agent, or Firm—Christopher P. Maiorana, P.C.

(57) ABSTRACT

A method for stress testing a memory array comprising the steps of (A) setting all memory cells in the memory array to a first digital state, (B) selecting all blocks of the memory array and (C) setting all wordlines in the memory array to a second digital state.

20 Claims, 3 Drawing Sheets

WORDLINE AND PSEUDO READ STRESS TEST FOR SRAM

FIELD OF THE INVENTION

The present invention relates to a method and/or architecture for implementing static random access memory (SRAM) stress tests generally and, more particularly, to a method and/or architecture for implementing a SRAM wordline and pseudo read stress test.

BACKGROUND OF THE INVENTION

During normal operation of conventional static random access memory (SRAM), only one wordline (WL) in a memory array is active at a supply potential (Vcc) at a time. The active wordline places a Vcc to ground potential (Vss) stress between the WL and features adjacent to the WL. The adjacent features are normally formed of polysilicon and/or metal. When the features adjacent to an active WL are at the ground potential Vss, an elevated supply potential Vcc will increase the electric field between the adjacent features resulting in (i) breakdown or (ii) worsening of process defects. The whole array address space (all WLs) can be cycled through at an elevated supply potential Vcc in normal operation. However, normal operation does not allow application of all possible combinations of Vcc to Vss stresses. Also, each gap between the WLs and adjacent features is only stressed for a short period of time. In many circuits functionality can be degraded (the SRAM fails to work properly) at Vcc levels that are sufficiently elevated to make the stress test worthwhile.

If all of the wordlines (WL) could be active at the same time, all adjacent gaps could be stressed simultaneously for a prolonged period of time without requiring the device to function (all wordlines WL active is nonfunctional by definition). However, selecting all wordlines (WL) at the same time can be destructive to a SRAM because cells sharing a common bitline will fight against one another and any static bitline loads, resulting in very significant currents in the device. Additionally, leakage faults between adjacent bitlines (BLs), that are not gross functional failures at sort, can become failures (i) after accelerated temperature stress during burn-in testing and (ii) after life stresses.

It is desirable to improve quality and yield of parts by detecting defects that normally only appear after life stresses, at wafer sort testing. Furthermore, a method and/or architecture that simultaneously stress tests all wordlines and bitlines in a SRAM without causing damage by excessive current would be desirable to accelerate/detect such defects.

SUMMARY OF THE INVENTION

The present invention concerns a method for stress testing a memory array comprising the steps of (A) setting all memory cells in the memory array to a particular digital state, (B) selecting all blocks of the memory array and (C) setting all wordlines in the memory array to another particular digital state.

The objects, features and advantages of the present invention include providing a method and/or architecture for implementing a static random access memory (SRAM) wordline and bitline stress test that may (i) improve quality and yield by detecting processing defects at sort that normally only appear during life stresses, (ii) stress all wordlines and bitlines in a SRAM simultaneously without causing damage due to excessive current, (iii) stress wordline and bitline features with a static supply voltage while having zero on-chip current, (iv) stress the wordline features of single wordline (SWL), double wordline (DWL) and/or other memory cell layouts, (v) simultaneously apply an elevated supply voltage stress across the entire SRAM array multiple cell features, (vi) be non-destructive, (vii) detect defects at sort that may cause post burn-in and/or post life stress failure, (viii) replace conventional high supply voltage functional testing with a much more stressful test, (ix) stress test bitlines/bitline bars, and/or (x) apply all combinations of Vcc to Vss stresses.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
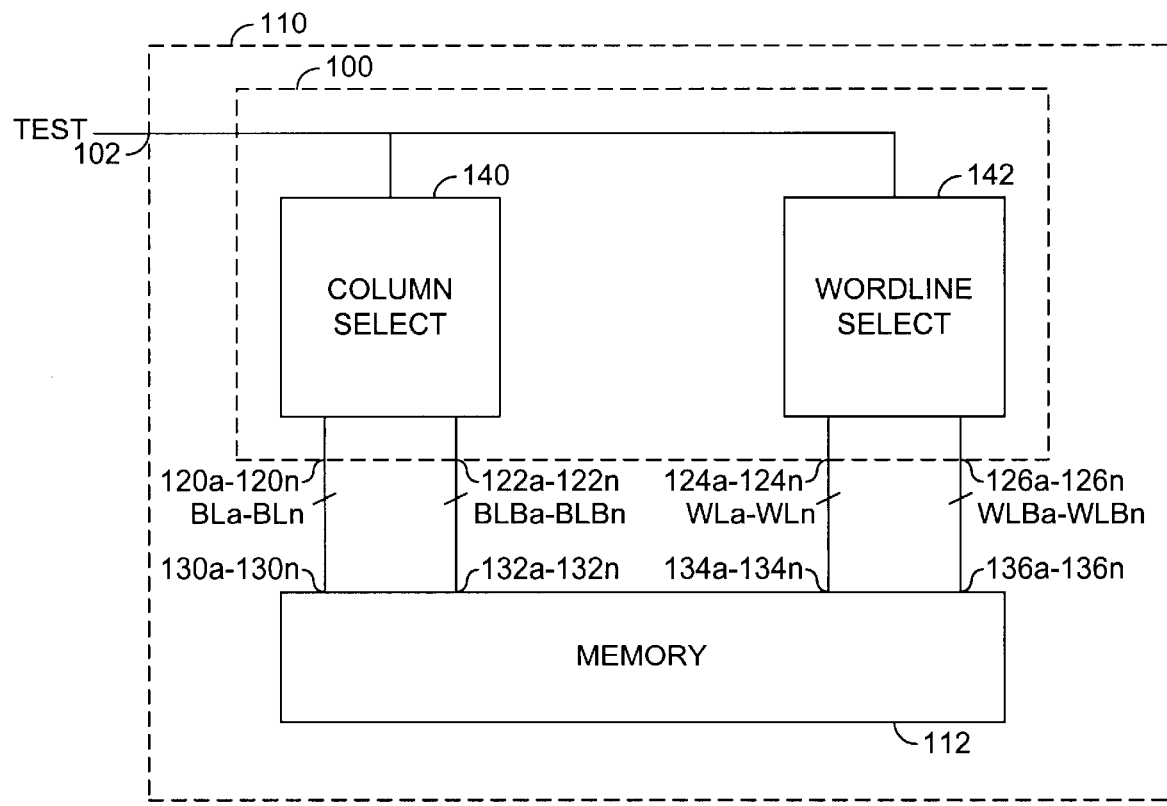
FIG. 1 is a block diagram of a preferred embodiment of the present invention.

Referring to FIG. 1, a block diagram of a circuit 100 illustrating a preferred embodiment of the present invention is shown. In one example, the circuit 100 may be implemented in the context of an integrated circuit 110. The circuit 100 may be implemented as a stress test circuit. The circuit 110 may also include a circuit 112. The circuit 112 may be a memory array circuit. The test circuit 100 may be configured to stress test the memory circuit 112.

The circuit 110 may have an input 102 that may receive a signal (e.g., TEST). The signal TEST may be a stress test enable signal. The circuit 100 may have an input that may receive the signal TEST, one or more inputs 120a–120n that may receive signals from one or more bitlines (e.g., BLa–BLn), one or more inputs 122a–122n that may receive signals from one or more bitline bars (e.g., BLBa–BLBn), one or more inputs 124a–124n that may receive signals from one or more wordlines (e.g., WLa–WLn), and one or more inputs 126a–126n that may receive signals from one or more wordline bars (e.g., WLBa–WLBn).

The circuit 112 may have one or more outputs 130a–130n that may present the one or more bitlines BLa–BLn, one or more outputs 132a–132n that may present the one or more bitline bars BLBa–BLBn, one or more inputs 134a–134n that may present the one or more wordlines WLa–WLn, and one or more outputs 136a–136n that may present the one or more wordline bars WLBa–WLBn. The bitline bars BLBa–BLBn and wordline bars WLBa–WLBn are digital complements of the bitlines BLa–BLn and wordlines WLa–WLn, respectively. The wordlines WL and wordline bars WLB may be local wordlines and wordline bars (e.g., LWL and LWLB) and/or global wordlines and wordline bars (e.g., GWL and GWLB). The various true signals may be active HIGH signals (e.g., 1 or "on"). The various complement signal bars may be active LOW signals (e.g., 0 or "off"). However, opposite polarities may be implemented accordingly to meet the design criteria of a particular implementation.

The circuit 112 may be a synchronous SRAM, an asynchronous SRAM, or other appropriate memory. In one example, the circuit 112 may be a single wordline (SWL) memory array. In another example, the circuit 112 may be a double word line (DWL) memory array. In other examples, the circuit 112 may comprise other memory cell layouts (e.g., single bitline or dual bitline).

The circuit 100 generally comprises a circuit 140 and a circuit 142. The circuit 140 may be implemented as a column and block select with a static pullup circuit. The circuit 142 may be implemented as a memory array wordline state select circuit. The circuit 140 may receive the signal TEST, the bitlines BLa–BLn, and the bitline bars BLBa–BLBn. The circuit 142 may receive the signal TEST, the wordline WLa–WLn, and the wordline bars WLBa–WLBn.

Figure 2:
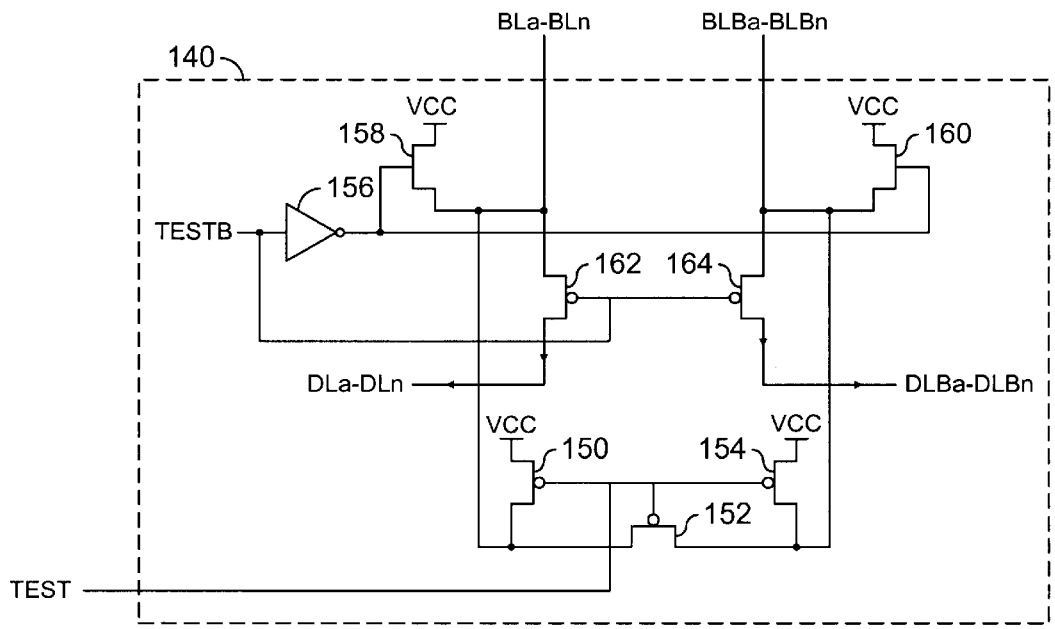
FIG. 2 is a schematic diagram of one possible embodiment of a column select circuit of FIG. 1.

Referring to FIG. 2, a schematic diagram illustrating the circuit 140 is shown. The circuit 140 generally comprises a transistor 150, a transistor 152, a transistor 154, a device 156, a transistor 158, a transistor 160, a transistor 162, and a transistor 164. The transistors 150, 152 and 154 may each have a gate that may receive the signal TEST. The transistor 150 may have a source that may receive a supply voltage (e.g., Vcc) and a drain that may be connected to a source of the transistor 152 and the bitlines BLa–BLn. The transistor 152 may have a drain that may be connected to a drain of the transistor 154 and the bitline. bars BLBa–BLBn. The transistor 154 may have a source that may be connected to the supply voltage Vcc. The device 156 may have an input that may receive a signal TESTB (e.g., a digital complement of the signal TEST) and an output that may present the signal TEST. The transistors 158 and 160 may each have a gate that may receive the signal TEST, and a source that may be connected to the supply voltage Vcc. The transistor 158 may have a drain that may be connected to the bitlines BLa–BLn.

The transistor 160 may have a drain that may be connected to the bitline bars BLBa–BLBn. The transistors 162 and 164 may each have a gate that may receive the signal TESTB. The transistor 162 may have a source that may be connected to the bitlines BLa–BLn and a drain that may be connected to one or more datalines (e.g., DLa–DLn). The transistor 164 may have a source that may be connected to the bitline bars BLBa–BLBn and a drain that may be connected to one or more dataline bars (e.g., DLBa–DLBn). In one example, the transistors 150, 152, 154, 162, and 164 may each be implemented as PMOS transistors. The device 156 may be a logical inverter. The transistors 158 and 160 may each be implemented as NMOS transistors. However, other devices and/or polarities may be implemented to meet the design criteria of a particular application. The signal TEST may be used to select a memory block and/or to select a column. The signal TESTB may be used to select a column.

Figure 3:
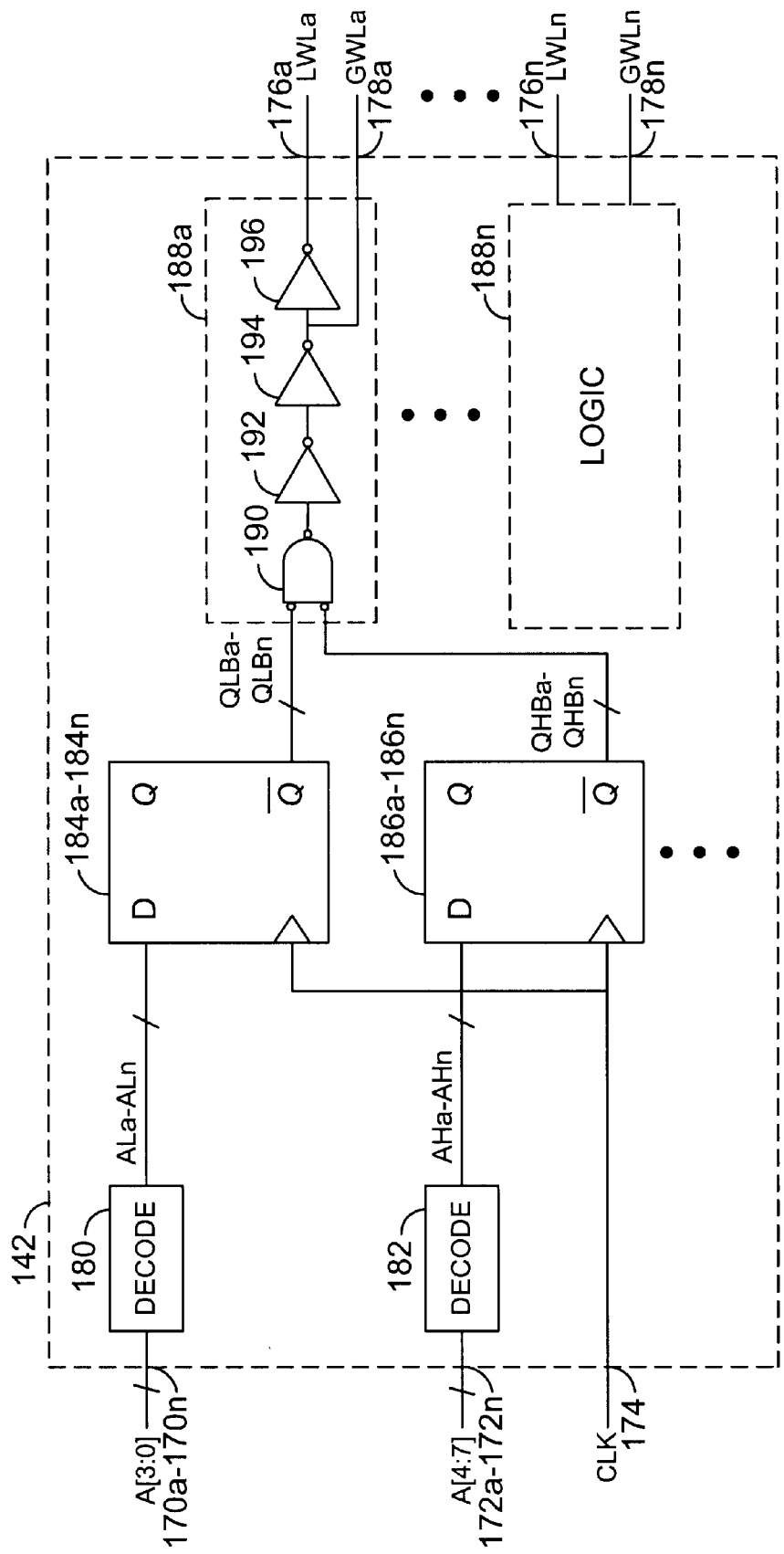
FIG. 3 is a diagram of a wordline select circuit of FIG. 1.

Referring to FIG. 3, a block diagram of the circuit 142 is shown. The circuit 142 may have one or more inputs 170a–170n that may receive one or more signals (e.g., A[0:3]), one or more inputs 172a–172n that may receive one or more signals (e.g., A[4:7]), an input 174 that may receive a signal (e.g., CLK), one or more inputs 176a–176n that may receive the local wordlines LWLa–LWLn, and one or more inputs 178a–178n that may receive the global wordlines GWLa–GWLn. The signal CLK may be an internally or externally generated clock signal. The signals A[0:3] and A[4:7] may be address signals. In one example, the signals A[0:3] and A[4:7] may be the lowest four bits and the highest four bits (e.g., the lower and upper bytes) of 8-bit address signals, respectively. However, other address lengths may be implemented to meet the design criteria of a particular application.

In one example (e.g., when the circuit 112 is a synchronous SRAM), the circuit 142 may comprise a circuit 180, a circuit 182, one or more devices 184a–184n, one or more devices 186a–186n, and one or more circuits 188a–188n. The device 180 may have an input that may receive the signal A[0:3] and an output that may present one or more signals (e.g., ALa–ALn). The device 182 may have an input that may receive the signal A[4:7] and an output that may present one or more signals (e.g., AHa–AHn). The signals ALa–ALn and AHa–AHn may be decoded addresses. The devices 180 and 182 may be address decoders.

Each of the devices 184 may have a D input that may receive the signal AL, an input that may receive the signal CLK, and a Q bar (e.g., QB) output that may present a signal (e.g., QLB). Each of the devices 186 may have a D input that may receive the signal AH, an input that may receive the signal CLK, and a QB output that may present a signal (e.g., QHB). The signals QLB and QHB may be register output signals.

In one example (e.g., when implemented as a synchronous SRAM), the devices 184 and 186 may be configured as predecode registers and the devices 184 and 186 may be D-type registers. In one example, each of the signals AL may be coupled to a register 184 and each of the signals AH may be coupled to a register 186 (e.g., an 4-bit address. decoder circuit 180 may be coupled to sixteen of the registers 184 and an 4-bit decoder circuit 182 may be coupled to sixteen of the registers 186). However, other registers and/or circuits may be implemented to meet the design criteria of a particular application.

Each of the circuits 188 may have a first input that may receive the signal QLB, a second input that may receive the signal QHB, an output that may present the local wordline LWL, and an output that may present the global wordline GWL. In one example, the circuit 188 may be implemented for each pair of the circuits 184 and 186 (e.g., when 256 of the circuits 184 and 186 are implemented, 256 of the circuits 188 are also implemented). In one example, each of the circuits 188 may comprise a gate 190, a device 192, a device 194 and a device 196. The gate 190 may have a first input that may receive the signal QLB, a second input that may receive the signal QHB, and an output that may be connected to an input of the device 192. The device 192 may have an output that may be connected to an input of the device 194. The device 194 may have an output that may be connected to an input of the device 196 and that may present the global wordline GWL. The device 196 may present the local wordline LWL. The gate 190 may be a NOR gate. The devices 192, 194, and 196 may be logical inverters. However, other types of gates and/or devices may be implemented to meet the design criteria of a particular application.

In another example (e.g., when implemented as an asynchronous SRAM), the circuit 142 may be implemented without the registers 184a–184n and 186a–186n. In an asynchronous SRAM circuit, a logic circuit may implemented to perform a set/reset function on the signals QLB and QHB. In an asynchronous SRAM circuit, one or more of the logic circuits may be implemented for each of the signals AL and/or AH (e.g., when 256 of the signals AL and or AH are presented, 256 of the logic circuits may be implemented). When the signal TEST is asserted, the circuit 142 may be configured to set/reset all the signals QLB and QHB to digital LOW (e.g., select all the local wordlines LWL and all the global wordlines GWL to digital HIGH).

Figure 4:
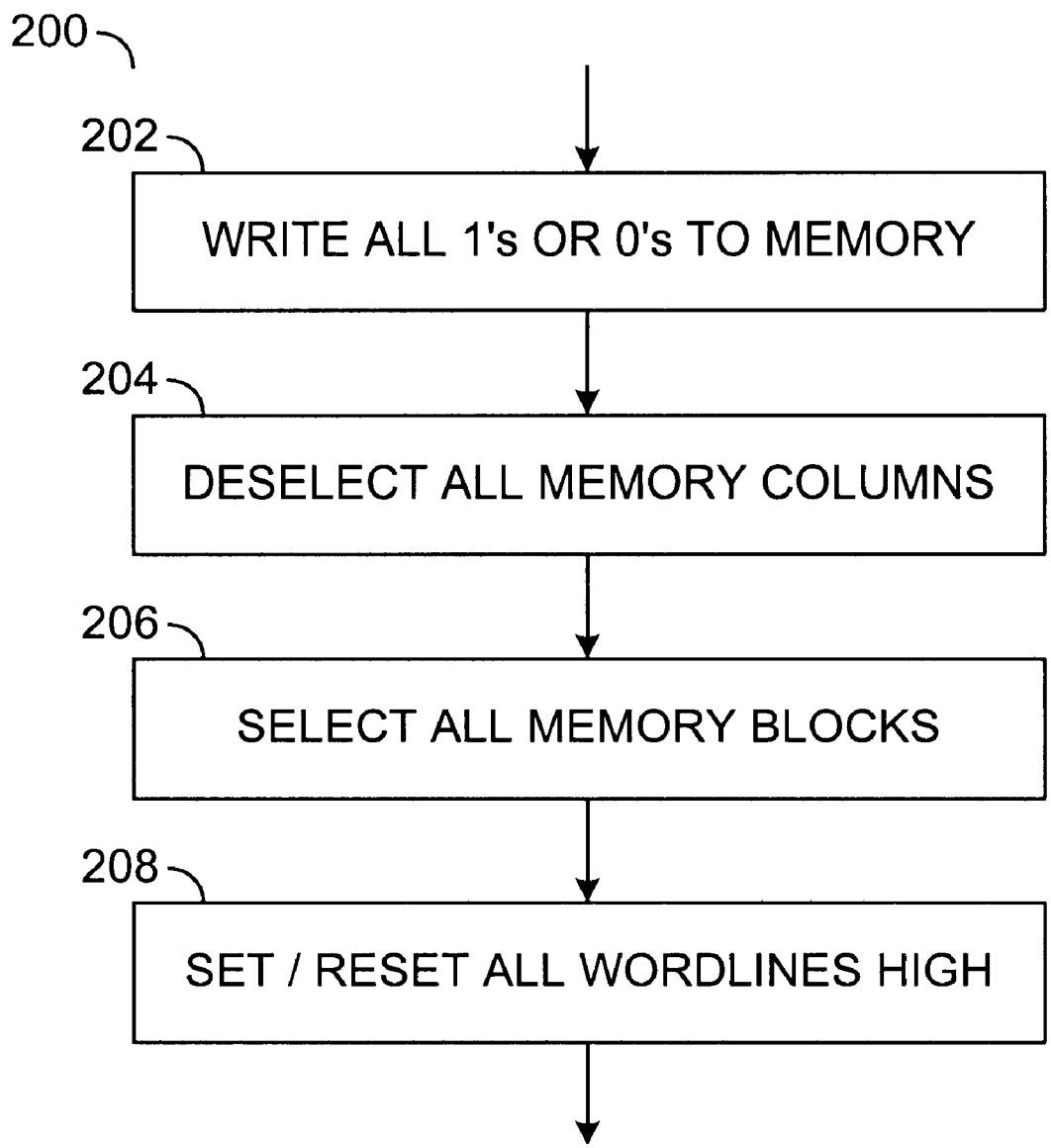
FIG. 4 is a diagram of a process of the present invention.

Referring to FIG. 4, a diagram 200 illustrating a process or operation (e.g., stress test) of the circuit 112 is shown when the circuit 100 is implemented. The stress test may be a SRAM to wordline and bitline stress test. The stress test may be controlled from a test mode scan chain. However, other test control methods and/or circuits may be implemented to meet the design criteria of a particular application. The stress test may comprise the following steps. First either all 1's or all 0's may be written to the memory array circuit 112 (e.g., block 202). Writing a background pattern of all 0's or all 1's in the memory array circuit 112 before selecting all of the local wordlines LWLa–LWLn and the global wordlines GWLa–GWLn generally prevents the memory cells that share common bitlines BL and/or bitline bars BLB from 'fighting' against one another.

Next, the signal TEST may be asserted. All of the columns in the memory array 112 may be deselected (e.g., block 204). All blocks in the memory array 112 may be selected (e.g., block 206). Deselecting all of the columns and selecting all of the blocks in the memory array circuit 112 may eliminate current flow in static bitline pullup circuits (e.g., the transistors 150, 154, 158 and 160 of the circuit 140). All of the signals QLBa–QLBn and QHBa–QHBn may be set to a digital LOW. All of the local wordlines LWLa–LWLn and the global wordlines GWL may be set/reset to a digital HIGH (e.g., selected) for a predetermined time (e.g., block 208). In another example, the columns may remain selected. A separate signal may be implemented to turn off the static bitline pullup circuits (e.g., the transistors 150, 154, 158 and 160 of the circuit 140).

When a background pattern of all 1's or all 0's is written in the memory array 112, all of the local wordlines LWLa–LWLn and the global wordline GWL are HIGH, and all of the columns in the memory array circuit 112 are deselected a number of events happen. For example, (i) leakage current across the columns in the memory array 112 may be prevented and (ii) adjacent bitlines BLa–BLn and bitline bars BLBa–BLBn of the memory array circuit 112 may be forced to opposite supply rails. When a background pattern of all 0's is written to the memory cells of the memory array 112, the bitlines BLa–BLn may be at a ground potential (e.g., Vss) and the bitline bars BLBa–BLBn may be at the supply voltage Vcc. Voltage stress may be applied to all of the bitlines and all of the wordlines simultaneously. The stress test may also stress the wordline/wordline bar and bitline/bitline bar feature gaps.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A method for stress testing a memory array comprising the steps of:
    (A) setting all memory cells in said memory array to a first digital state;
    (B) selecting all blocks of said memory array; and
    (C) setting all wordlines in said memory array to a second digital state.
2. The method according to claim 1, wherein said method further comprises the step of:
    (D) holding all of said wordlines at said second digital state for a predetermined time.

3. The method according to claim 1, wherein step B further comprises the sub-step of:
    (B-1) deselecting all columns of said memory array.
4. The method according to claim 1, wherein step C alternatively comprises:
    (C') setting all wordlines in said memory array to said first digital state.
5. The method according to claim 1, wherein said method is conducted using a test mode scan chain.
6. An apparatus comprising:
    a first circuit configured to select all blocks of a memory array in response to a control signal; and
    a second circuit configured to set all wordlines of said memory array to a first digital state in response to said control signal.
7. The apparatus according to claim 6, wherein said first circuit is further configured to deselect all of said columns of said memory array in response to said control signal.
8. The apparatus according to claim 6, wherein said memory array is configured in response to said one or more memory cells.
9. The apparatus according to claim 8, wherein said memory array is configured to write said first digital state or a second digital state to all of said one or more memory cells in response to a test mode scan chain.
10. The apparatus according to claim 9, wherein said control signal is asserted in response to a test mode scan chain.
11. The apparatus according to claim 6, wherein said memory array is implemented as a synchronous static random access memory (SRAM).
12. The apparatus according to claim 6, wherein said memory array is implemented as an asynchronous static random access memory (SRAM).
13. The apparatus according to claim 7, wherein said columns of said memory array comprise one or more bitline and bitline bar complementary pairs.
14. The apparatus according to claim 6, wherein said wordlines comprise (i) one or more local wordline and wordline bar complementary pairs and/or (ii) one or more global wordline and wordline bar complementary pairs.
15. The apparatus according to claim 13, wherein said first circuit comprises a first transistor, a second transistor, a third transistor, a fourth transistor, a fifth transistor, and a sixth transistor, wherein:
    said control signal is coupled to a gate of said first, second, fifth and sixth transistors;
    an inverse of said control signal is coupled to a gate of said third and fourth transistors;
    said bitlines are coupled to a drain of said first, third and fifth transistors; and
    said bitline bars are coupled to a drain of said second, fourth and sixth transistors.
16. The apparatus according to claim 15, wherein said first, second, third and fourth transistors are PMOS transistors and the said fifth and sixth transistors are NMOS transistors.
17. The apparatus according to claim 6, wherein said second circuit comprises one or more serially coupled decoder circuits, register circuits, logic gates, and amplifier circuits.
18. The apparatus according to claim 17, wherein said register circuits are D-type registers.
19. The apparatus according to claim 6, wherein said apparatus comprises one or more static bitline pullup circuits configured to be turned off in response to a second control signal.

20. An apparatus comprising:

means for setting all memory cells in said memory array to a first digital state;

means for selecting all blocks of said memory array; and means for setting all wordlines in a memory array to a second digital state.

* * * * *